US012431384B2

(12) United States Patent
Shimada

(10) Patent No.: US 12,431,384 B2
(45) Date of Patent: Sep. 30, 2025

(54) SUBSTRATE PROCESSING APPARATUS

(71) Applicant: Tokyo Electron Limited, Tokyo (JP)

(72) Inventor: Koichi Shimada, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 595 days.

(21) Appl. No.: 17/869,096

(22) Filed: Jul. 20, 2022

(65) Prior Publication Data

US 2023/0033715 A1  Feb. 2, 2023

(30) Foreign Application Priority Data

Jul. 28, 2021  (JP) .................................. 2021-123397

(51) Int. Cl.
| | | |
|---|---|---|
| *H01L 21/687* | (2006.01) | |
| *C23C 16/458* | (2006.01) | |
| *H01L 21/67* | (2006.01) | |
| *H01L 21/673* | (2006.01) | |
| *H01L 21/677* | (2006.01) | |

(52) U.S. Cl.
CPC .... *H01L 21/68792* (2013.01); *C23C 16/4583* (2013.01); *H01L 21/67303* (2013.01); *H01L 21/67306* (2013.01); *H01L 21/67745* (2013.01); *H01L 21/67757* (2013.01); *H01L 21/67069* (2013.01); *H01L 21/67115* (2013.01); *H01L 21/68785* (2013.01)

(58) Field of Classification Search
CPC ......... H01L 21/67303; H01L 21/67306; H01L 21/67309; H01L 21/6732; H01L 21/67742; H01L 21/67745; H01L 21/67757; H01L 21/68792; H01L 21/67069; H01L 21/67115; H01L 21/68785; C23C 16/4583

See application file for complete search history.

(56) References Cited

U.S. PATENT DOCUMENTS

| | | | | |
|---|---|---|---|---|
| 5,356,476 A | * | 10/1994 | Foster | ..................... C23C 16/14 118/724 |
| 6,120,605 A | * | 9/2000 | Sato | ..................... C23C 16/4412 118/725 |
| 6,957,956 B2 | * | 10/2005 | Toba | .................. H01L 21/67109 432/237 |
| 2009/0081887 A1 | * | 3/2009 | Inoue | ..................... C23C 16/56 257/E21.328 |
| 2019/0177847 A1 | * | 6/2019 | Tomizawa | .......... C23C 16/4586 |
| 2019/0390337 A1 | * | 12/2019 | Mustafa | .............. C23C 16/4586 |
| 2020/0187305 A1 | * | 6/2020 | Saido | .................. C23C 16/4584 |
| 2021/0002768 A1 | * | 1/2021 | Takewaki | .............. H01L 21/324 |

FOREIGN PATENT DOCUMENTS

| | | |
|---|---|---|
| JP | 2009-141205 A | 6/2009 |
| JP | 2018-067582 A | 4/2018 |

\* cited by examiner

*Primary Examiner* — Kurt Sweely
(74) *Attorney, Agent, or Firm* — Nath, Goldberg & Meyer; Jerald L. Meyer; Tanya E. Harkins

(57) ABSTRACT

A substrate processing apparatus includes: a first boat configured to hold substrates in a shelf shape; a second boat provided coaxially with the first boat and configured to hold substrates in a shelf shape; and a drive configured to rotate the first boat and the second boat in a synchronized manner and configured to raise and lower the second boat relative to the first boat.

12 Claims, 19 Drawing Sheets

SUBSTRATE PROCESSING APPARATUS

CROSS-REFERENCE TO RELATED APPLICATION

This application is based upon and claims the benefit of priority from Japanese Patent Application No. 2021-123397, filed on Jul. 28, 2021, the entire contents of which are incorporated herein by reference.

TECHNICAL FIELD

The present disclosure relates to a substrate processing apparatus.

BACKGROUND

There is known an apparatus that accommodates a boat holding a plurality of substrates in a processing chamber and performs a film forming process on the plurality of substrates (for example, Patent Documents 1 and 2). Patent Document 1 discloses a double-structure boat including an inner boat and an outer boat that can move independently in a vertical direction. Patent Document 2 discloses a holding means including a first holding boat for holding wafers and a second holding boat for holding an induction heating element.

PRIOR ART DOCUMENTS

Patent Documents

Patent Document 1: Japanese Laid-Open Patent Publication No. 2018-67582
Patent Document 2: Japanese Laid-Open Patent Publication No. 2009-141205

SUMMARY

According to one embodiment of the present disclosure, there is provided a substrate processing apparatus including: a first boat configured to hold substrates in a shelf shape; a second boat provided coaxially with the first boat and configured to hold substrates in a shelf shape; and a drive configured to rotate the first boat and the second boat in a synchronized manner and configured to raise and lower the second boat relative to the first boat.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
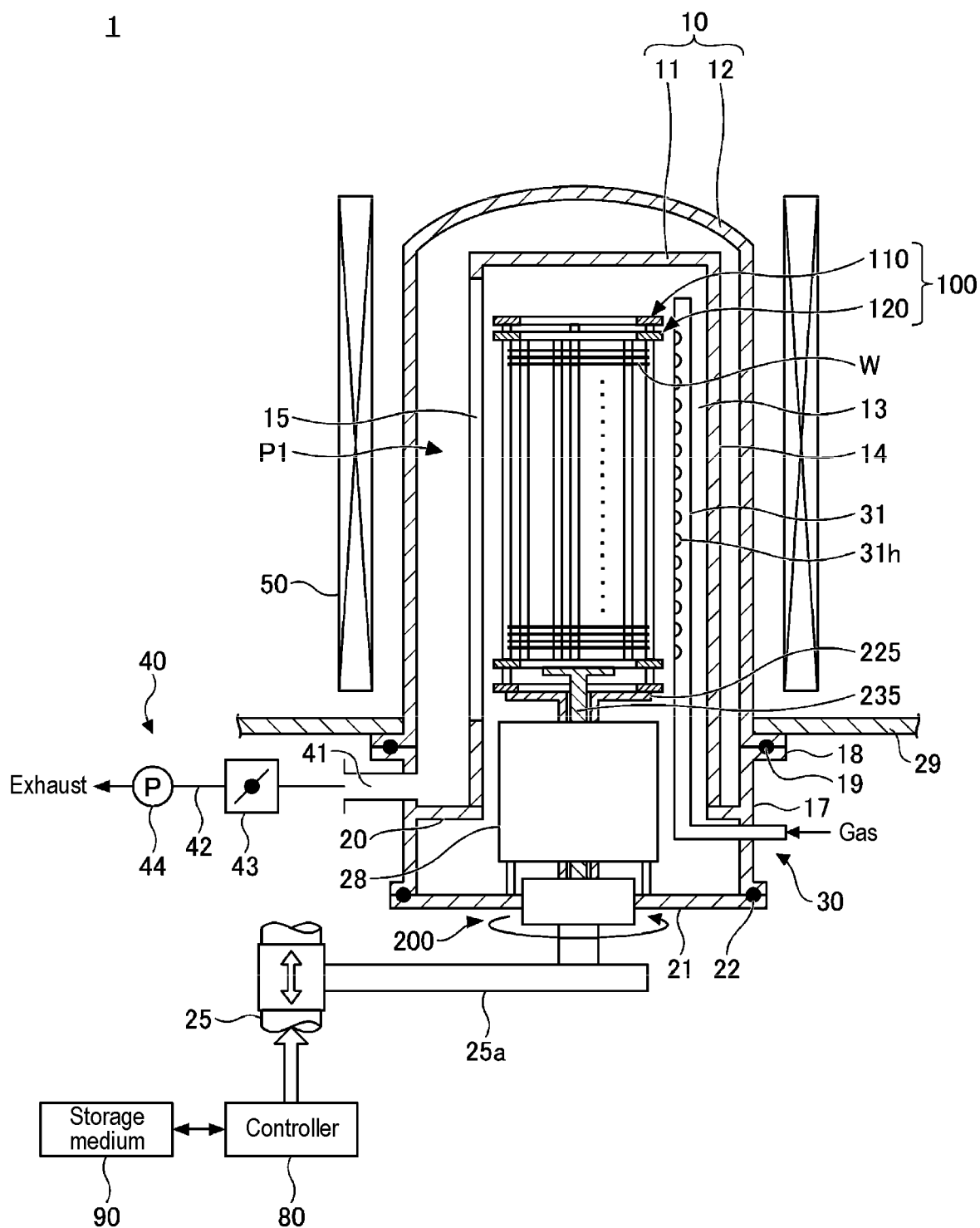
FIG. 1 is a cross-sectional view showing an example of a substrate processing apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, non-limiting exemplary embodiments of the present disclosure will be described with reference to the accompanying drawings. Throughout the accompanying drawings, the same or corresponding members or parts are designated by the same or corresponding reference numerals, and the duplicate descriptions thereof are omitted.

Substrate Sticking

When a film-forming process is performed by mounting substrates on claws provided on a boat and accommodating the boat in a processing container while keeping the substrates mounted on the boat, the substrates may stick to the claws. In particular, when thick polysilicon films are formed on the substrates, the substrates easily stick to the claws.

As an example of measures for preventing a substrate from sticking to claws, there is a technique of forming fine irregularities on surfaces of the claws to reduce a contact area between the claws and the substrate. However, in a case where a film thickness formed on the substrate is large, the substrate may stick to the claws even when the above technique is applied.

The present disclosure provides a technique that can prevent a substrate from sticking to a boat by using a substrate holder provided with a first boat and a second boat, which move relatively and vertically, and being capable of delivering the substrate between the first boat and the second boat. Hereinafter, the technique will be described in detail.

Substrate Processing Apparatus

An example of a substrate processing apparatus according to an embodiment will be described with reference to FIG.

1. The substrate processing apparatus according to the embodiment is a batch type apparatus that processes a plurality of substrates simultaneously.

The substrate processing apparatus 1 includes a processing container 10, a gas supply 30, an exhauster 40, a heater 50, and a controller 80.

An interior of the processing container 10 can be depressurized. The processing container 10 accommodates substrates W. The substrates W are, for example, semiconductor wafers. The processing container 10 includes an inner tube 11 and an outer tube 12. The inner tube 11 has a substantially cylindrical shape with a closed ceiling and an open lower end. The outer tube 12 has a substantially cylindrical shape with a closed ceiling and an open lower end and covers the outside of the inner tube 11. The inner tube 11 and the outer tube 12 are made of a heat-resistant material such as quartz or the like, and are disposed coaxially to form a double-tube structure.

The ceiling of the inner tube 11 is, for example, flat. On one side of the inner tube 11, an accommodator 13 for accommodating a gas nozzle is formed along a longitudinal direction (vertical direction) of the inner tube 11. The accommodator 13 is a region in a protrusion 14 formed by causing a part of a side wall of the inner tube 11 to protrude outward.

A rectangular opening 15 extending along the longitudinal direction (vertical direction) of the inner tube 11 is formed on the side wall of the inner tube 11 opposite to the accommodator 13.

The opening 15 is a gas exhaust port formed so as to exhaust a gas in the inner tube 11 therethrough. A length of the opening 15 is equal to a length of a substrate holder 100, or extends longer in the vertical direction than the length of the substrate holder 100.

A lower end of the processing container 10 is supported by a substantially cylindrical manifold 17 made of, for example, stainless steel. A flange 18 is formed at an upper end of the manifold 17, and a lower end of the outer tube 12 is installed on and supported by the flange 18. A seal 19 such as an O-ring or the like is interposed between the flange 18 and the lower end of the outer tube 12 to keep an interior of the outer tube 12 in an airtight state.

A support 20 having a substantially annular shape is provided on an inner wall of an upper portion of the manifold 17. The support 20 is installed to support a lower end of the inner tube 11. A lid 21 is airtightly attached to an opening at a lower end of the manifold 17 via a seal 22 such as an O-ring or the like. The lid 21 has a substantially disk shape and airtightly closes the opening at the lower end of the processing container 10, i.e., the opening of the manifold 17. The lid 21 is made of, for example, stainless steel.

A drive 200 is provided to penetrate a central portion of the lid 21. A lower portion of the drive 200 is rotatably supported by an arm 25a of a lifter 25 composed of a boat elevator. The drive 200 rotates a first boat 110 and a second boat 120 in a synchronized manner, and raises and lowers the second boat 120 relative to the first boat 110. Further, the lid 21, the drive 200, the first boat 110, and the second boat 120 are moved up and down as a unit in response to a vertical movement of the lifter 25. As a result, the first boat 110 and the second boat 120 are loaded and unloaded with respect to the interior of the processing container 10. Details of the drive 200 will be described later.

The first boat 110 and the second boat 120 constitute a substrate holder 100 that holds a plurality of (for example, 50 to 150) substrates W in a shelf shape. Details of the substrate holder 100 will be described later.

A heat insulating table 28 is provided on the lid 21. The heat insulating table 28 prevents the substrate holder 100 from being cooled by heat transfer with a side of the lid 21, and retains heat of the substrate holder 100. For example, the heat insulating table 28 has a configuration in which a plurality of quartz plates arranged substantially horizontally at intervals in the vertical direction is attached to a plurality of columns provided on the lid 21.

The gas supply 30 includes a gas nozzle 31. The gas nozzle 31 is made of, for example, quartz. The gas nozzle 31 is provided inside the inner tube 11 so as to extend along the longitudinal direction of the inner tube 11, and a base end of the gas nozzle 31 is bent in an L shape and supported by penetrating the manifold 17. The gas nozzle 31 has a plurality of gas holes 31h arranged along a longitudinal direction thereof, and discharges a processing gas from the plurality of gas holes 31h in a horizontal direction. For example, the gas holes 31h are arranged at the same intervals as intervals of the substrates W supported by the substrate holder 100. A type of the processing gas is not limited. Examples of the processing gas include a film forming gas, an etching gas, and a purge gas.

In the example of FIG. 1, a case where the gas supply 30 includes one gas nozzle 31 has been described. However, the number of gas nozzles is not limited. For example, the gas supply 30 may include a plurality of gas nozzles. In such a case, the plurality of gas nozzles may be configured to discharge the same processing gas, or may be configured to discharge different processing gases.

The exhauster 40 exhausts a gas, which is discharged from the inner tube 11 via the opening 15 and then discharged from a gas outlet 41 via a space P1 between the inner tube 11 and the outer tube 12. The gas outlet 41 is formed on a side wall of the upper portion of the manifold 17 and formed above the support 20. An exhaust path 42 is connected to the gas outlet 41. A pressure regulation valve 43 and a vacuum pump 44 are sequentially installed in the exhaust path 42 so that the interior of the processing container 10 can be evacuated.

The heater 50 is provided around the outer tube 12. The heater 50 is provided over, for example, a base plate 29. The heater 50 has a substantially cylindrical shape so as to cover the outer tube 12. The heater 50 includes, for example, a heating element and heats the substrates W in the processing container 10.

The controller 80 is configured to control operations of respective components of the substrate processing apparatus 1. The controller 80 may be, for example, a computer. A computer program that operates the respective components of the substrate processing apparatus 1 is stored in a storage medium 90. The storage medium 90 may be, for example, a flexible disk, a compact disk, a hard disk, a flash memory, a DVD, or the like.

[Substrate Holder]

Figure 2:
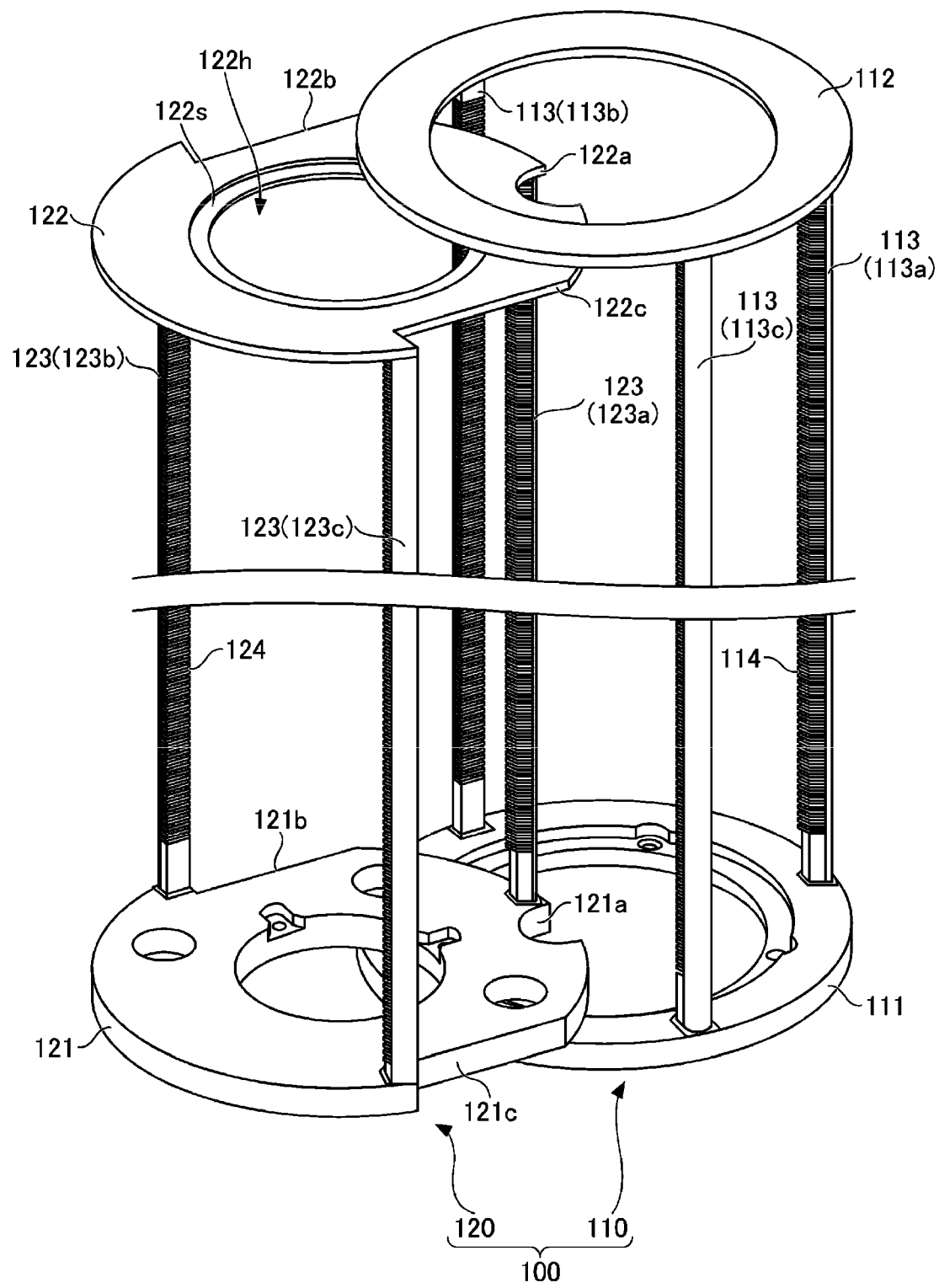
FIG. 2 is a perspective view showing an example of a substrate holder.
Figure 3:
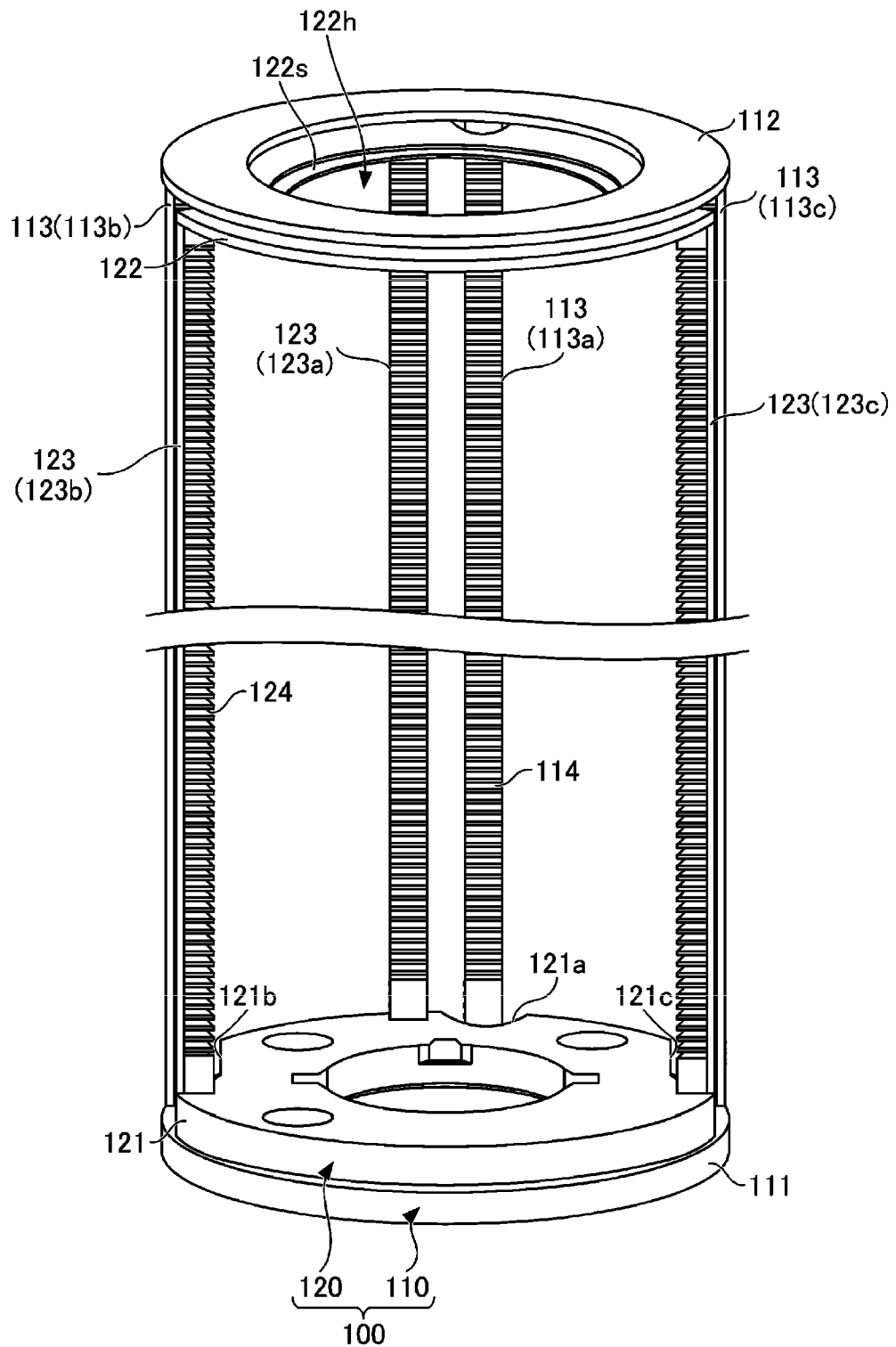
FIG. 3 is a perspective view showing the example of the substrate holder.

An example of the substrate holder 100 included in the substrate processing apparatus 1 of the embodiment will be described with reference to FIGS. 2 to 5. FIG. 2 is a perspective view showing a substrate holder in a state in which a second boat is being attached to a first boat, and FIG. 3 is a perspective view showing a substrate holder in a state in which a second boat has been attached to a first boat.

The substrate holder 100 can be accommodated in the processing container 10 and is configured to hold a plurality of substrates substantially horizontally at intervals in the vertical direction. The substrate holder 100 includes the first boat 110 and the second boat 120.

The first boat 110 includes a bottom plate 111, a top plate 112, and support columns 113 (113a to 113c). The bottom plate 111, the top plate 112, and the support columns 113 are made of a heat-resistant material such as, for example, quartz or silicon carbide.

The bottom plate 111 is supported by an outer support 225, which will be described later. The bottom plate 111 has a substantially annular plate shape having an outer diameter larger than an outer diameter of the substrate to be held. The bottom plate 111 may have a substantially disk shape.

The top plate 112 is provided above the bottom plate 111 and faces the bottom plate 111. Just like the bottom plate 111, the top plate 112 has a substantially annular plate shape having an outer diameter larger than the outer diameter of the substrate to be held. The top plate 112 may have a substantially disk shape.

The support columns 113 have a rod shape extending in the vertical direction, and connects the bottom plate 111 and the top plate 112. The three support columns 113a to 113c have the same length. The support columns 113a to 113c are provided so that center points thereof are located on the same circle. A plurality of grooves 114 is formed on each of the support columns 113a to 113c at intervals in the vertical direction. The grooves 114 form mounting surfaces 115 (see FIGS. 4 and 5) on which the substrates are mounted. By mounting the substrates on the mounting surfaces 115, the substrates are held by the support columns 113.

The second boat 120 is configured to be attachable and detachable with respect to the first boat 110 by horizontal movement. The second boat 120 is provided coaxially with the first boat 110 and is configured to be capable of moving up and down relative to the first boat 110. The second boat 120 includes a bottom plate 121, a top plate 122, and support columns 123 (123a to 123c). The bottom plate 121, the top plate 122, and the support columns 123 are made of a heat-resistant material such as quartz or silicon carbide.

The bottom plate 121 is supported by an inner support 235, which will be described later, and is disposed above the bottom plate 111. The bottom plate 121 has a substantially annular plate shape having an outer diameter larger than the outer diameter of the substrate to be held, and is disposed so as to overlap with the bottom plate 111 in a plan view. The bottom plate 121 may have a substantially disk shape. Notches 121a to 121c into which the support columns 113a to 113c are inserted are formed in an outer edge portion of the bottom plate 121. The notches 121a to 121c are formed so that the bottom plate 121 and the support columns 113a to 113c do not come into contact with each other when the second boat 120 is horizontally moved and attached to the first boat 110.

The top plate 122 is provided above the bottom plate 121 and below the top plate 112 and faces the bottom plate 121. Just like the bottom plate 121, the top plate 122 has a substantially annular plate shape having an outer diameter larger than the outer diameter of the substrate to be held. Notches 122a to 122c into which the support columns 113a to 113c are inserted are formed in an outer edge portion of the top plate 122. The notches 122a to 122c are formed so that the top plate 122 and the columns 113a to 113c do not come into contact with each other when the second boat 120 is horizontally moved and attached to the first boat 110. A recessed surface 122s is formed on an inner edge portion of the top plate 122. The recessed surface 122s has an upper surface lower than an upper surface of the top plate 122, and functions as a mounting surface for mounting a lid (not shown) that closes an opening 122h of the top plate 122. The top plate 122 may have a substantially disk shape.

The support columns 123 have a rod shape extending in the vertical direction, and connects the bottom plate 121 and the top plate 122. The three support columns 123a to 123c have the same length. The support columns 123a to 123c are provided so that center points thereof are located on the same circle as the circle through which the center points of the support columns 113a to 113c pass. The support columns 123a to 123c are shorter than the columns 113a to 113c, respectively. A plurality of grooves 124 is formed in each of the support columns 123a to 123c at intervals in the vertical direction. The grooves 124 form mounting surfaces 125 (see FIGS. 4 and 5) on which substrates are mounted. By mounting the substrates on the mounting surfaces 125, the substrates are held by the support columns 123.

[Delivery of Substrate]

Figure 4:
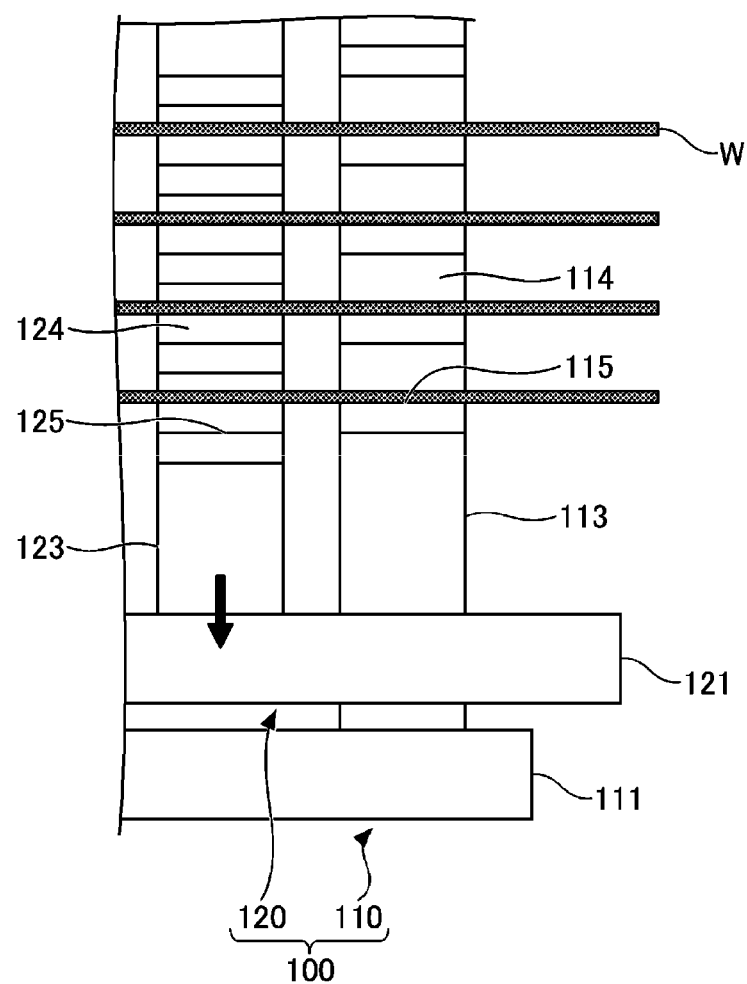
FIG. 4 is a side view showing the substrate holder in a state in which substrates are held by a first boat.

An example of delivery of substrates in the substrate holder 100 will be described with reference to FIGS. 4 and 5. FIG. 4 is a side view showing a substrate holder in a state in which substrates are held by a first boat, and FIG. 5 is a side view showing a substrate holder in a state in which substrates are held by a second boat.

When the substrates W are held by the first boat 110, as shown in FIG. 4, the second boat 120 is lowered until positions of the mounting surfaces 125 are located below positions of the mounting surfaces 115. As a result, the substrates W are mounted on the mounting surfaces 115 and are spaced apart from the mounting surfaces 125.

Figure 5:
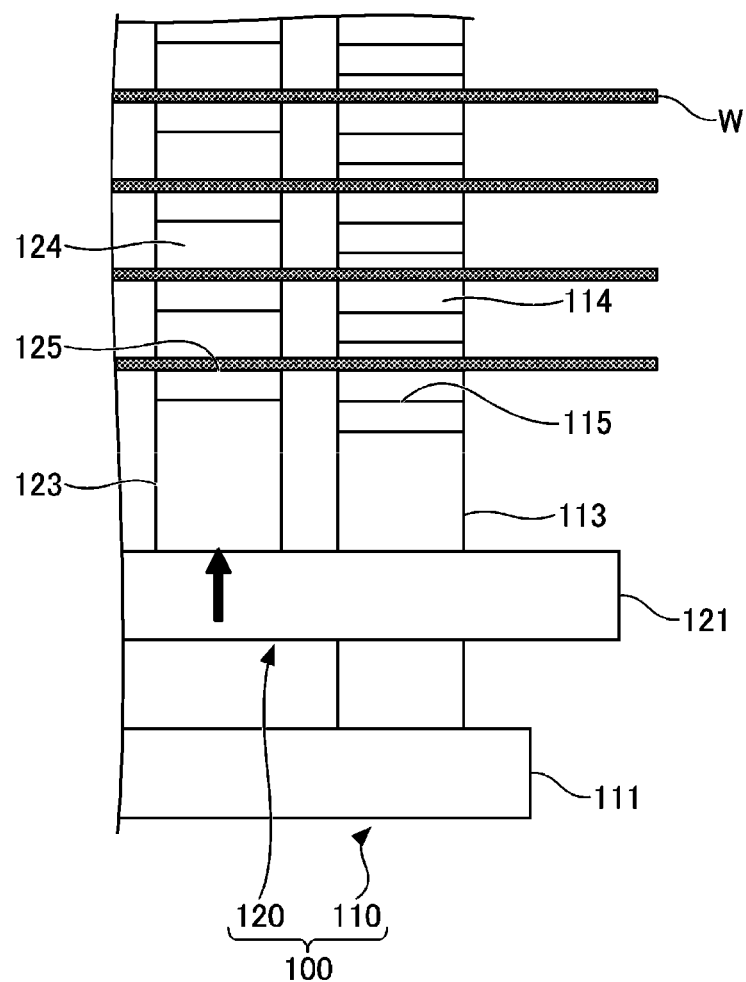
FIG. 5 is a side view showing the substrate holder in a state in which substrates are held by a second boat.
Figure 6:
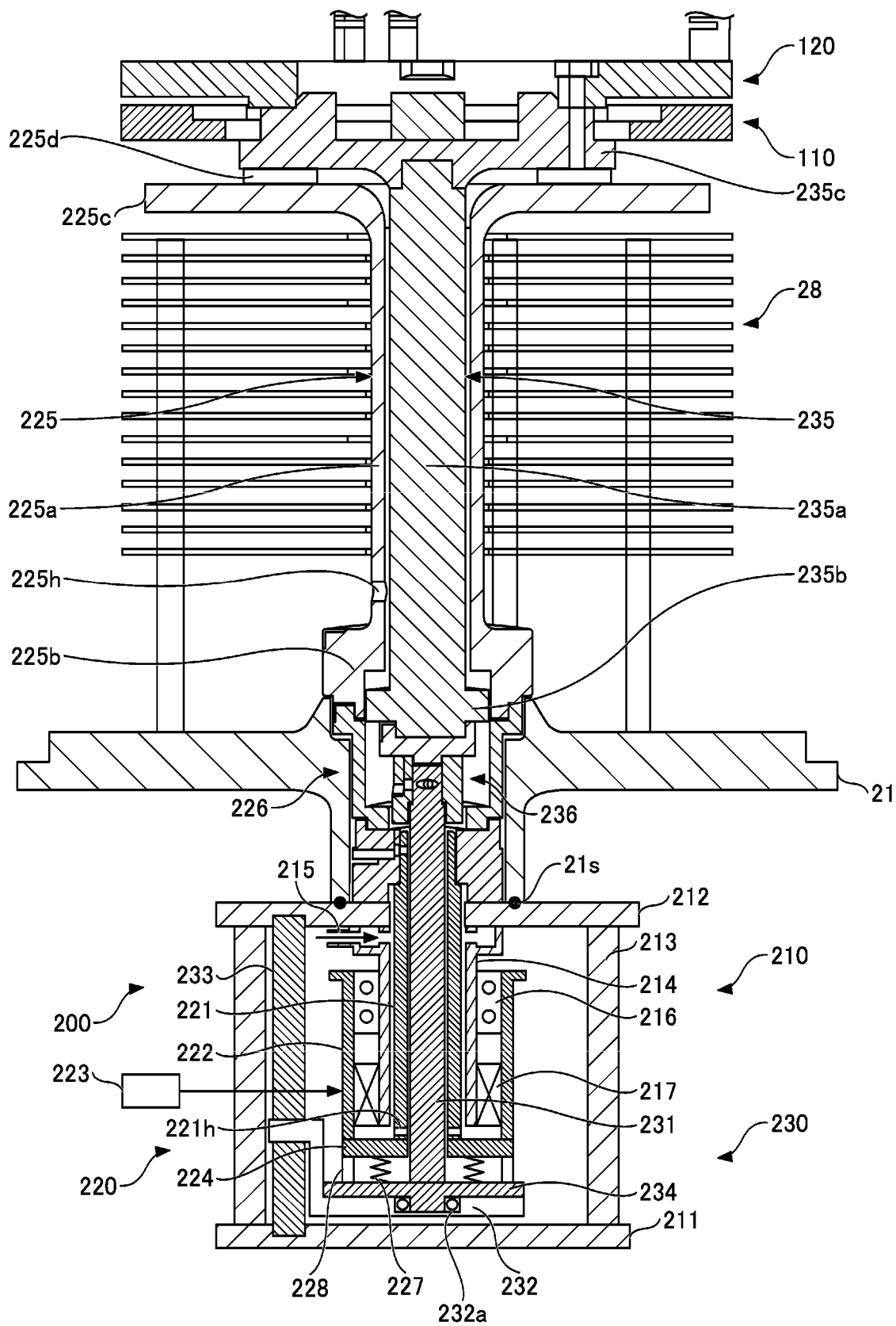
FIG. 6 is a cross-sectional view showing an example of a drive for driving the substrate holder.
Figure 7:
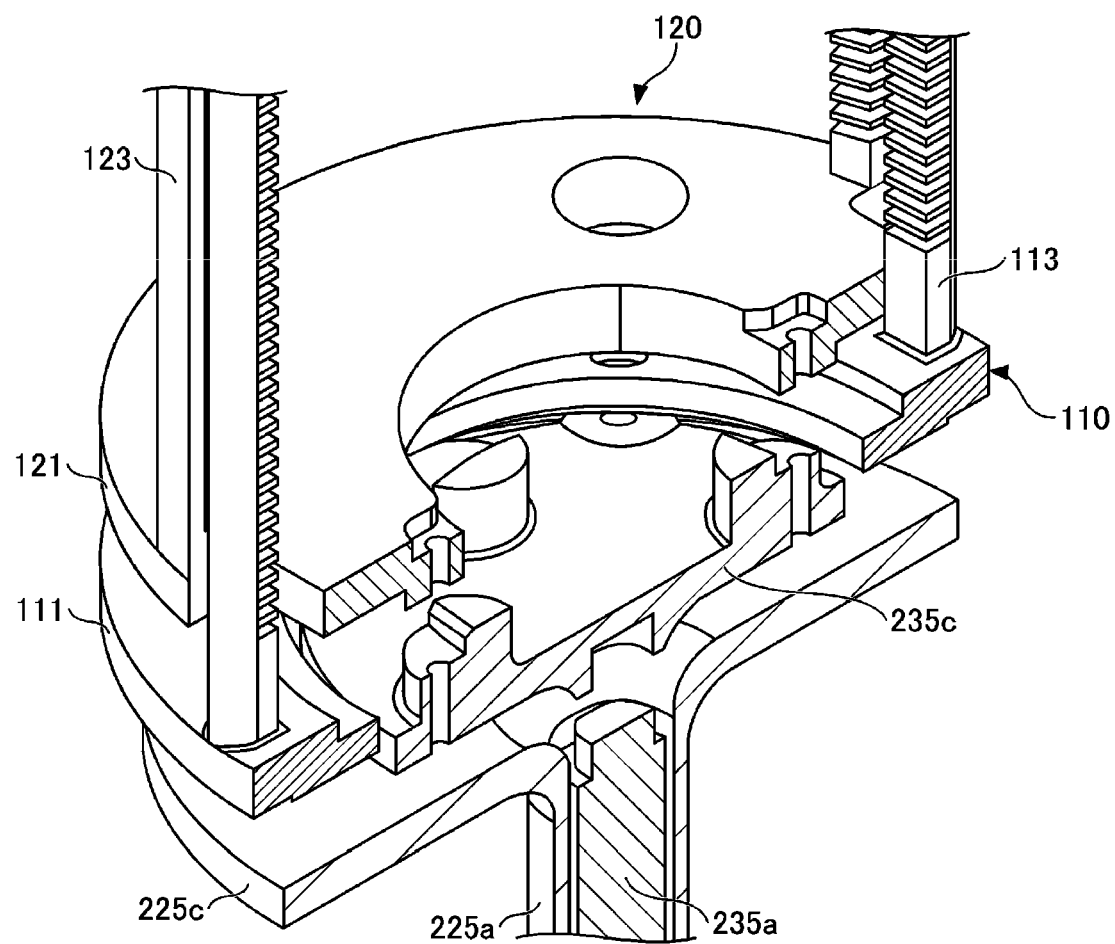
FIG. 7 is a cross-sectional exploded perspective view illustrating an outer support and an inner support.

When the substrates W are held by the second boat 120, as shown in FIG. 5, the second boat 120 is raised until the positions of the mounting surfaces 125 are located above the positions of the mounting surfaces 115. As a result, the substrates W are mounted on the mounting surfaces 125 and are spaced apart from the mounting surfaces 115.

For example, when the substrate holder 100 in which the substrates W are held by the first boat 110 is accommodated in the processing container 10 and the substrates W are subjected to a film forming process in the processing container 10, the second boat 120 is raised with respect to the first boat 110 in the middle of the film forming process. As a result, the substrates W held by the first boat 110 are delivered to the second boat 120. In addition, the second boat 120 is lowered with respect to the first boat 110 while the substrates W are held by the second boat 120. As a result, the substrates W held by the second boat 120 are delivered to the first boat 110. By delivering the substrates W between the first boat 110 and the second boat 120 as described above during the film forming process, the substrates W are not continuously mounted on the mounting surfaces 115 and the mounting surfaces 125. As a result, it is possible to prevent the substrates W from sticking to the mounting surfaces 115 and the mounting surfaces 125. In the middle of the film forming process, the delivery of the substrates W between the first boat 110 and the second boat 120 may be repeated a plurality of times.

[Drive]

An example of a drive will be described with reference to FIGS. 6 to 15C. The drive 200 rotates the first boat 110 and the second boat 120 in a synchronized manner, and raises and lowers the second boat 120 relative to the first boat 110. The drive 200 includes a fixed part 210, a rotary part 220, and a rotary linear movement part 230.

The fixed part 210 includes a bottom plate 211, a top plate 212, a connector 213, a fixed sleeve 214, and a purge gas introduction port 215.

The bottom plate 211 is supported by the arm 25a (see FIG. 1) of the lifter 25, and is raised and lowered relative to the processing container 10.

The top plate 212 is provided above the bottom plate 211 and faces the bottom plate 211. An opening is formed in a central portion of the top plate 212, and a rotary shaft 221 and a linear motion shaft 231 described later are inserted into the opening. A lower end of the lid 21 is connected to the top plate 212 via a seal 21s such as an O-ring or the like.

The connector 213 is a columnar body extending in the vertical direction, and is configured to connect the bottom plate 211 and the top plate 212.

The fixed sleeve 214 has a substantially hollow cylindrical shape extending downward from the central portion of the top plate 212. A rotary body 222, which will be described later, is rotatably provided on an outer periphery of the fixed sleeve 214 via a bearing 216. Below the bearing 216, a magnetic fluid seal 217 is provided between the fixed sleeve 214 and the rotary body 222. The magnetic fluid seal 217 airtightly seals a gap between the fixed sleeve 214 and the rotary body 222.

The purge gas introduction port 215 is provided so as to penetrate a side wall of the fixed sleeve 214, and introduces a purge gas into the fixed sleeve 214. By introducing the purge gas into the fixed sleeve 214 from the purge gas introduction port 215, it is possible to prevent the processing gas discharged from the gas nozzle 31 from flowing into the gap between the fixed sleeve 214 and the rotary shaft 221. The purge gas is an inert gas such as, for example, an Ar gas or an $N_2$ gas.

The rotary part 220 includes the rotary shaft 221, the rotary body 222, a rotational drive source 223, a connector 224, the outer support 225, and an outer connector 226.

The rotary shaft 221 has a substantially hollow cylindrical shape. The rotary shaft 221 is inserted into the fixed sleeve 214 with a slight gap left from an inner surface of the fixed sleeve 214. The outer support 225 is connected to an upper end of the rotary shaft 221 via the outer connector 226. The connector 224 is connected to a lower end of the rotary shaft 221, and the rotary body 222 is connected to the connector 224. The rotary shaft 221 is formed with a through-hole 221h for bringing the gap between the fixed sleeve 214 and the rotary shaft 221 into communication with a gap between the rotary shaft 221 and the linear motion shaft 231.

The through-hole 221h guides the purge gas introduced into the fixed sleeve 214 from the purge gas introduction port 215 toward the interior of the rotary shaft 221. As a result, it is possible to prevent the processing gas discharged from the gas nozzle 31 from flowing into the gap between the rotary shaft 221 and the linear motion shaft 231. The through-hole 221h may be formed so as to penetrate the connector 224, and may be configured to guide the purge gas toward the gap between the rotary shaft 221 and the linear motion shaft 231. The rotary shaft 221 is made of, for example, a metal.

The rotary body 222 is rotatably provided on the outer periphery of the fixed sleeve 214 via the bearing 216. The connector 224 is connected to a lower end of the rotary body 222.

The rotational drive source 223 is, for example, a motor, and is configured to rotate the rotary body 222.

The connector 224 connects the lower end of the rotary body 222 and the lower end of the rotary shaft 221. As a result, the rotary shaft 221, the rotary body 222, and the connector 224 are rotated as a unit. An elevating drive plate 234 is connected to a lower surface of the connector 224 via a bellows 227 and a spline 228. As a result, a region surrounded by the rotary shaft 221, the connector 224, the linear motion shaft 231, and the elevating drive plate 234 is airtightly sealed. Further, the rotary shaft 221, the connector 224, the linear motion shaft 231, and the elevating drive plate 234 are rotated in synchronization with one another. The rotary shaft 221, the rotary body 222, and the connector 224 may be integrated.

The outer support 225 is made of, for example, quartz, and includes a shaft portion 225a, a lower end portion 225b, a flange portion 225c, and a support protrusion 225d.

The shaft portion 225a has a substantially hollow cylindrical shape. A through-hole 225h that penetrates a side wall of the shaft portion 225a is formed in a lower portion of the shaft portion 225a. The through-hole 225h discharges the purge gas flowing upward via a gap between the shaft portion 225a and a shaft portion 235a to the outside of the shaft portion 225a. As a result, while the lid 21 airtightly closes the opening at the lower end of the processing container 10, the purge gas introduced from the purge gas introduction port 215 is prevented from being blown out from an upper end of the shaft portion 225a toward the substrate holder 100. As a result, it is possible to prevent a flow of the processing gas discharged from the gas nozzle 31 toward the substrate holder 100 from being disturbed by the purge gas.

The lower end portion 225b is formed at a lower end of the outer support 225, and is connected to the rotary shaft 221 via the outer connector 226.

The flange portion 225c is formed at an upper end of the outer support 225. A plurality of (e.g., four) support protrusions 225d is provided on the flange portion 225c at intervals along a circumferential direction of the flange portion 225c.

Figure 8:
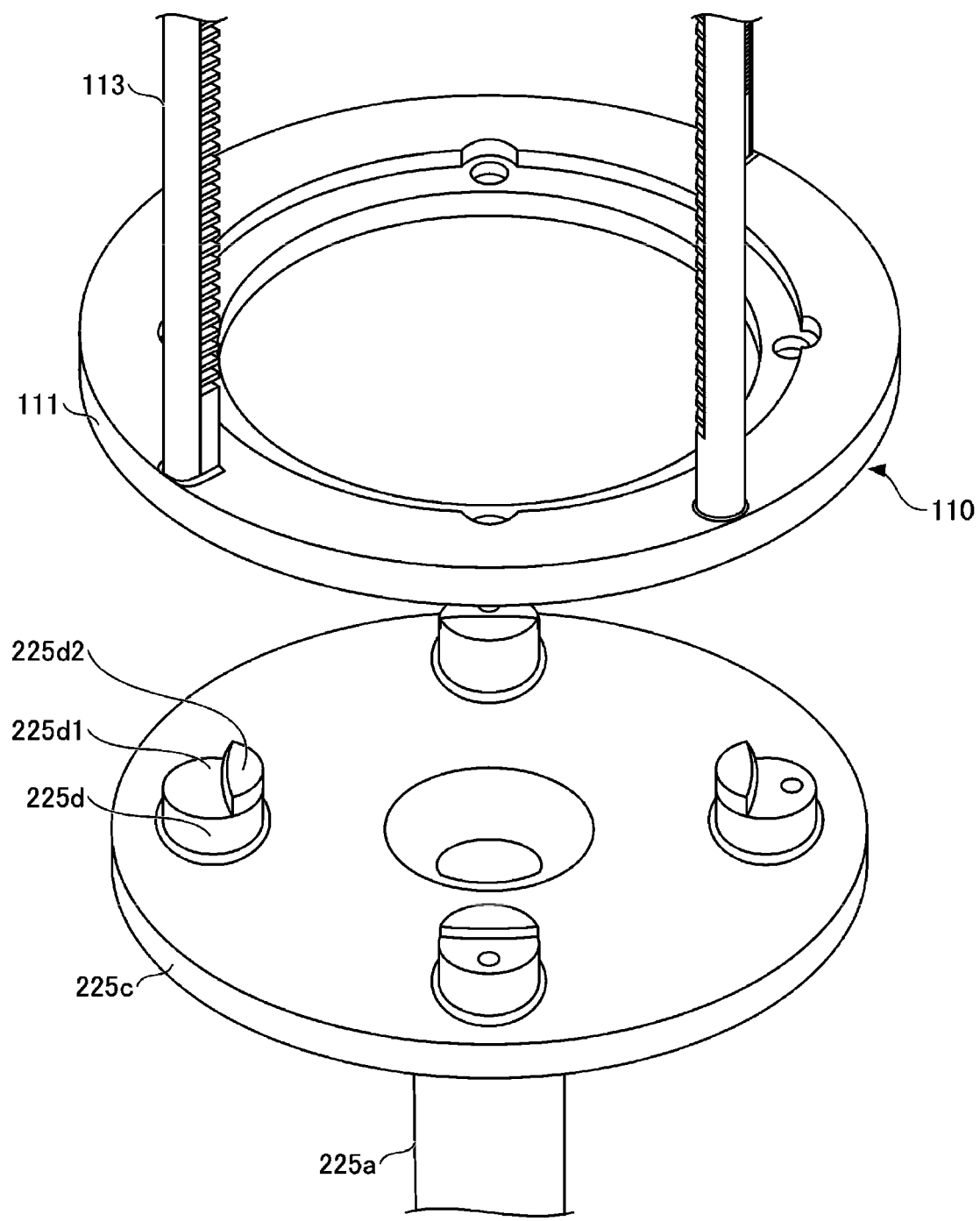
FIG. 8 is an exploded perspective view illustrating the outer support.
Figure 9:
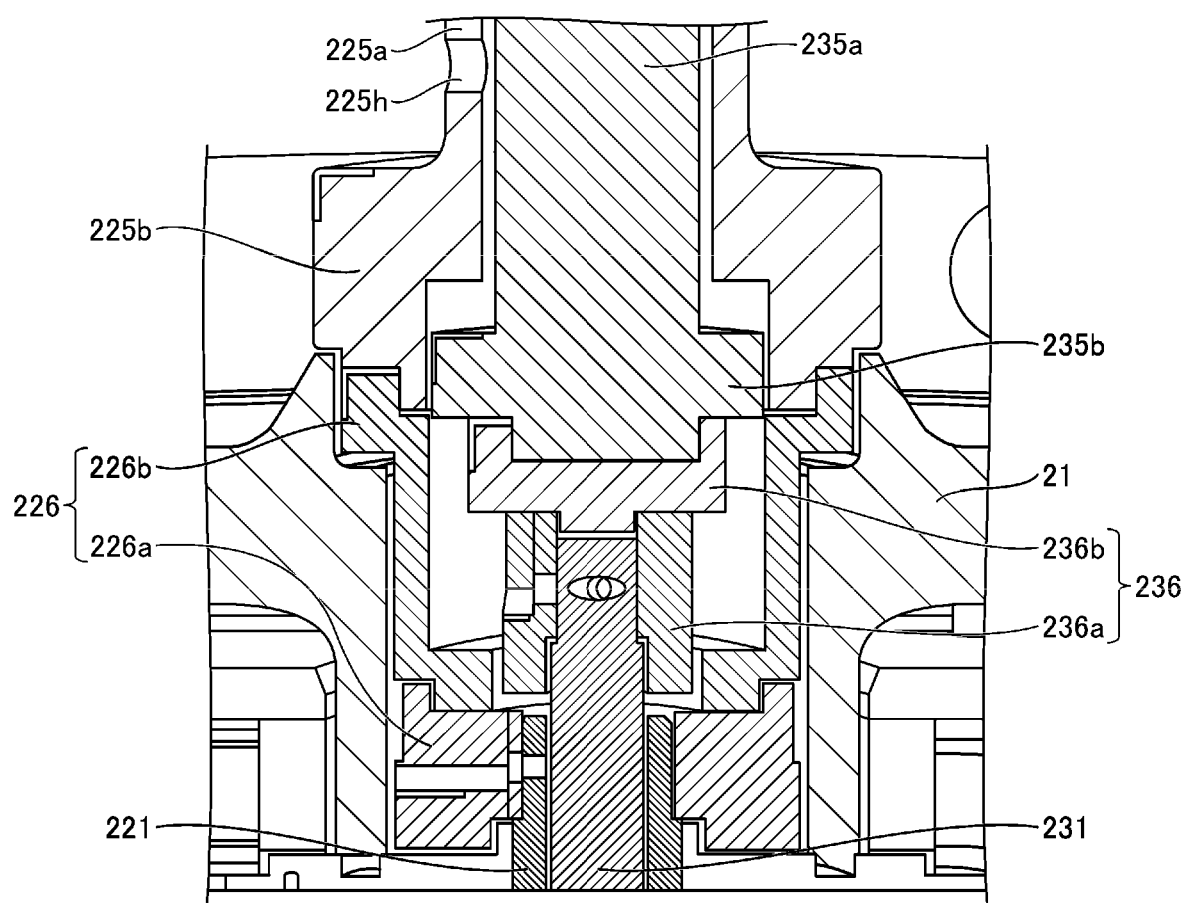
FIG. 9 is a sectional view illustrating an outer connector and an inner connector.
Figure 10:
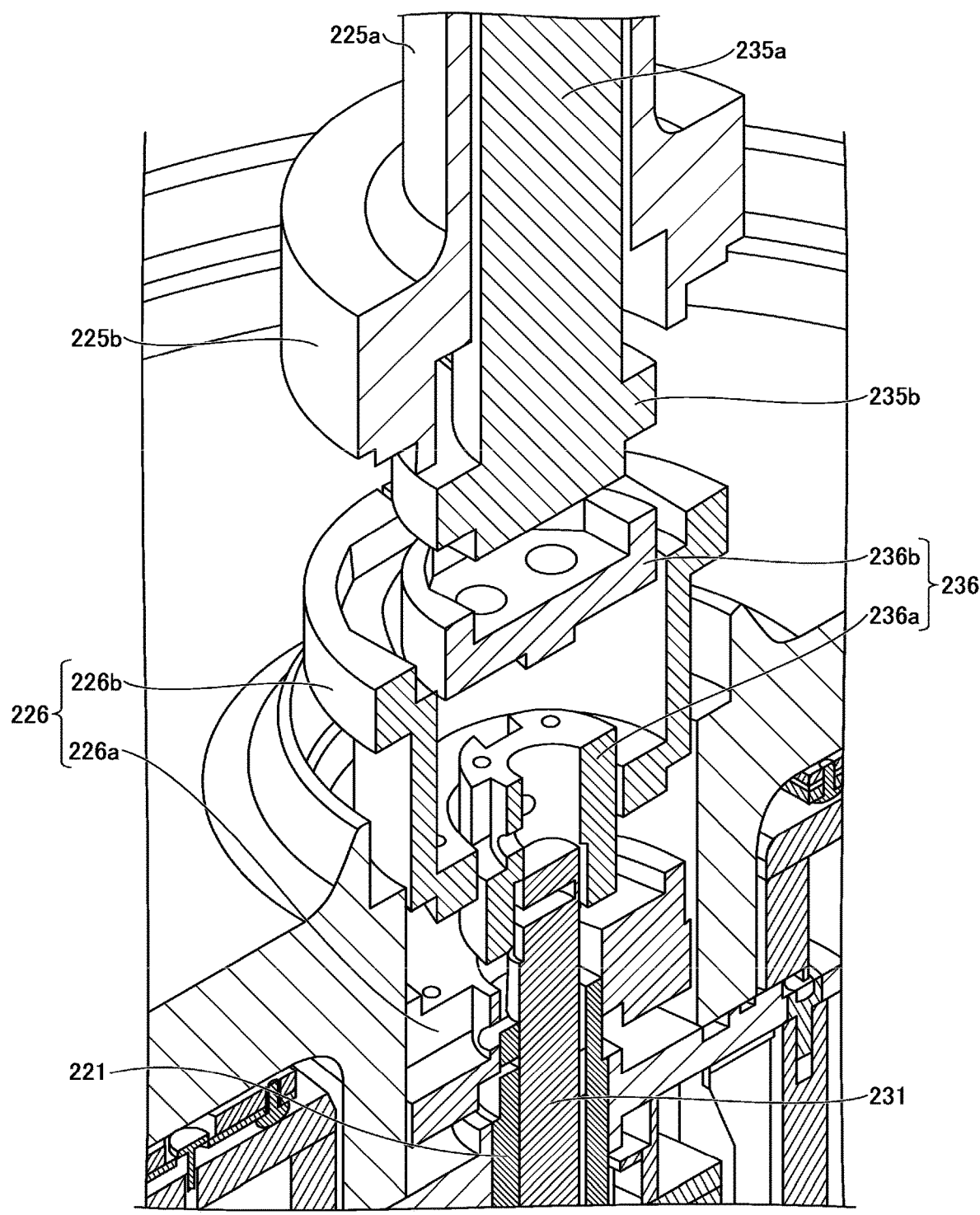
FIG. 10 is a cross-sectional exploded perspective view illustrating the outer connector and the inner connector.
Figure 11:
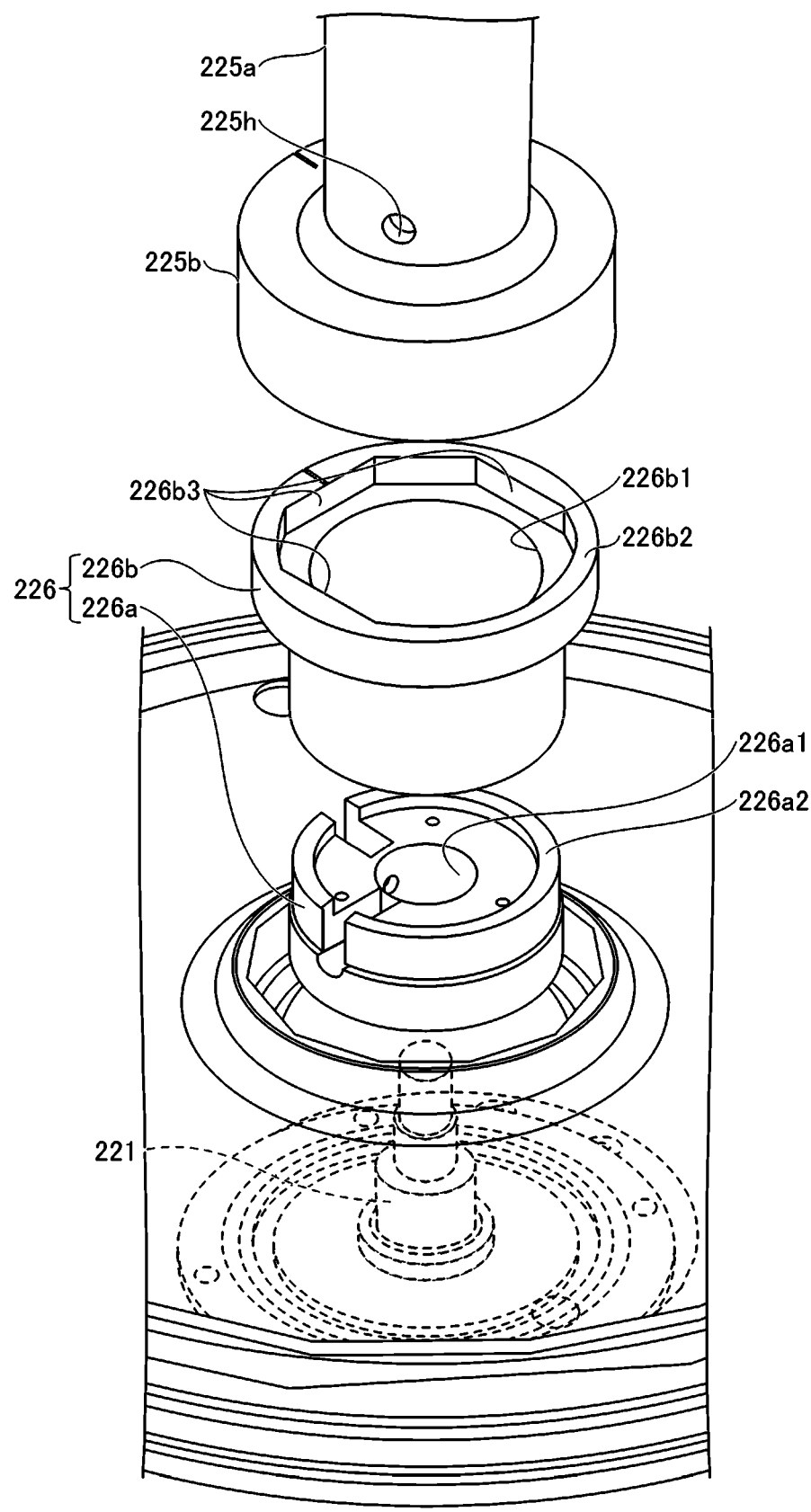
FIG. 11 is an exploded perspective view illustrating the outer connector.
Figure 12A:
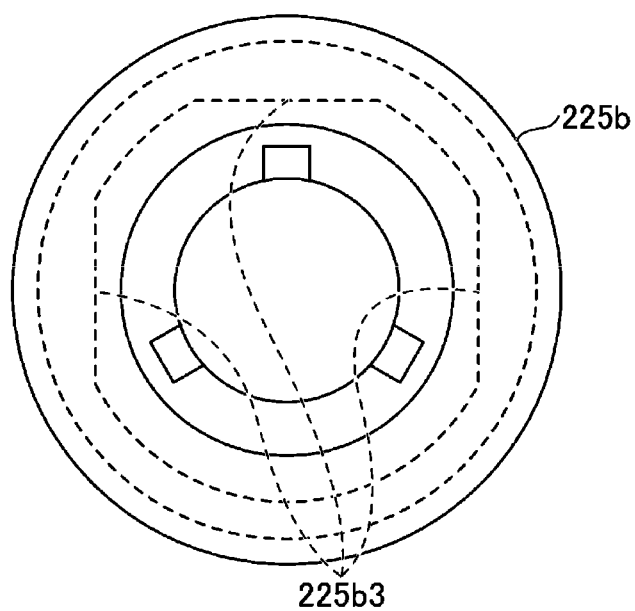
FIGS. 12A, 12B, and 12C are plan views illustrating the outer connector.
Figure 12B:
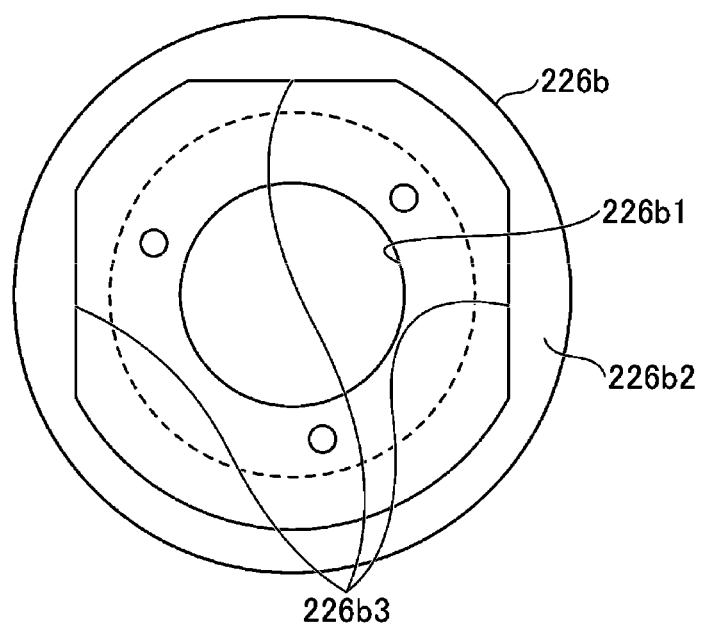
Figure 12C:
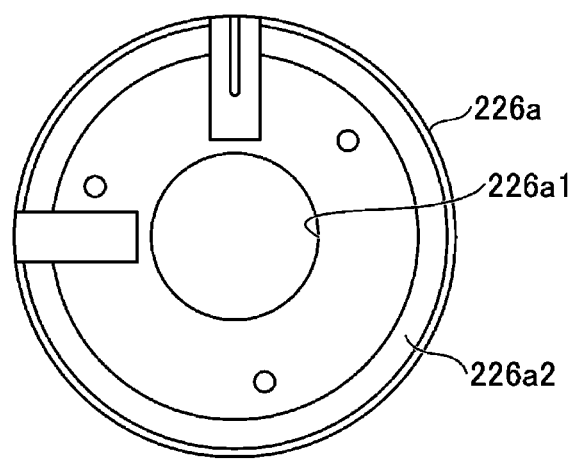

Each support protrusion 225d includes a mounting surface 225d1 and a positioner 225d2 (see FIG. 8). The first boat 110 is supported on the support protrusion 225d in a state of being positioned by mounting the bottom plate 111 on each mounting surface 225d1 and engaging an inner peripheral surface of the bottom plate 111 with the positioner 225d2.

The outer connector 226 connects the rotary shaft 221 and the outer support 225. The outer connector 226 includes a hub 226a and a hub 226b.

The hub 226a is made of the same material as the material constituting the rotary shaft 221, for example, a metal. The hub 226a has a substantially hollow cylindrical shape in which a through-hole 226a1 penetrating in the vertical direction is formed. An inner diameter of a lower end of the through-hole 226a1 is set to be slightly larger than an outer diameter of the upper end of the rotary shaft 221. As a result, the rotary shaft 221 can be inserted into the through-hole 226a1 and fit into the hub 226a. The hub 226a is fixed to the rotary shaft 221 by a screw or the like. A substantially annular guide protrusion 226a2 protruding from an upper surface of the hub 226a is formed on an outer edge of the upper surface of the hub 226a. An inner diameter of the guide protrusion 226a2 is set to be slightly larger than the outer diameter of the lower end of the hub 226b. As a result, the lower end of the hub 226b is fit into the hub 226a.

The hub 226b is made of a material having a smaller thermal expansion coefficient than the material constituting the hub 226a and having a larger thermal expansion coefficient than the material constituting the outer support 225. For example, the hub 226b is made of a ceramic material such as silicon nitride ($Si_3N_4$) or the like. The hub 226b has a substantially hollow cylindrical shape in which a through-hole 226b1 penetrating in the vertical direction is formed. A substantially annular guide protrusion 226b2 protruding from an upper surface of the hub 226b is formed on an outer edge of the upper surface of the hub 226b. The guide protrusion 226b2 has three flat surface portions 226b3. An inner diameter of the guide protrusion 226b2 is set to be slightly larger than an outer diameter of the lower end of the lower end portion 225*b*. As a result, the lower end of the lower end portion 225*b* is fit into the hub 226*b*. Further, at the lower end of the lower end portion 225*b*, three flat surface portions 225*b*3 corresponding to the three flat surface portions 226*b*3 are formed. As the three flat surface portions 225*b*3 are engaged with the three flat surface portions 226*b*3, the outer support 225 is positioned relative to the hub 226*b*.

The rotary linear motion part 230 includes a linear motion shaft 231, an elevating stage 232, an elevating drive source 233, an elevating drive plate 234, an inner support 235, and an inner connector 236.

The linear motion shaft 231 has a substantially solid columnar shape. The linear motion shaft 231 is inserted into the rotary shaft 221 with a slight gap left from an inner surface of the rotary shaft 221. The inner support 235 is connected to an upper end of the linear motion shaft 231 via the inner connector 236. The elevating drive plate 234 is connected to a lower end of the linear motion shaft 231. The linear motion shaft 231 is made of, for example, a metal.

The elevating stage 232 is raised and lowered by a driving force of the elevating drive source 233. The elevating drive plate 234 is installed on the elevating stage 232 via a bearing 232*a*.

The elevating drive source 233 is, for example, a ball screw, and is configured to raise and lower the elevating stage 232.

The elevating drive plate 234 is connected to the lower end of the linear motion shaft 231. In response to the vertical movement of the elevating stage 232, the elevating drive plate 234 is moved up and down together with the elevating stage 232, so that the linear motion shaft 231 is raised and lowered relative to the rotary shaft 221. The elevating drive plate 234 may be integrated with the linear motion shaft 231.

The inner support 235 is made of, for example, quartz, and includes a shaft portion 235*a*, a lower end portion 235*b*, a flange portion 235*c* and a support protrusion 235*d*.

The shaft portion 235*a* has a substantially solid columnar shape. The shaft portion 235*a* is inserted into the shaft portion 225*a* with a slight gap left from an inner surface of the shaft portion 225*a*.

The lower end portion 235*b* is formed at a lower end of the inner support 235, and is connected to the linear motion shaft 231 via the inner connector 236.

The flange portion 235*c* is detachably attached to an upper end of the shaft portion 235*a*. A plurality of (e.g., four) support protrusions 235*d* is provided on the flange portion 235*c* at intervals along a circumferential direction of the flange portion 235*c*.

Figure 13:
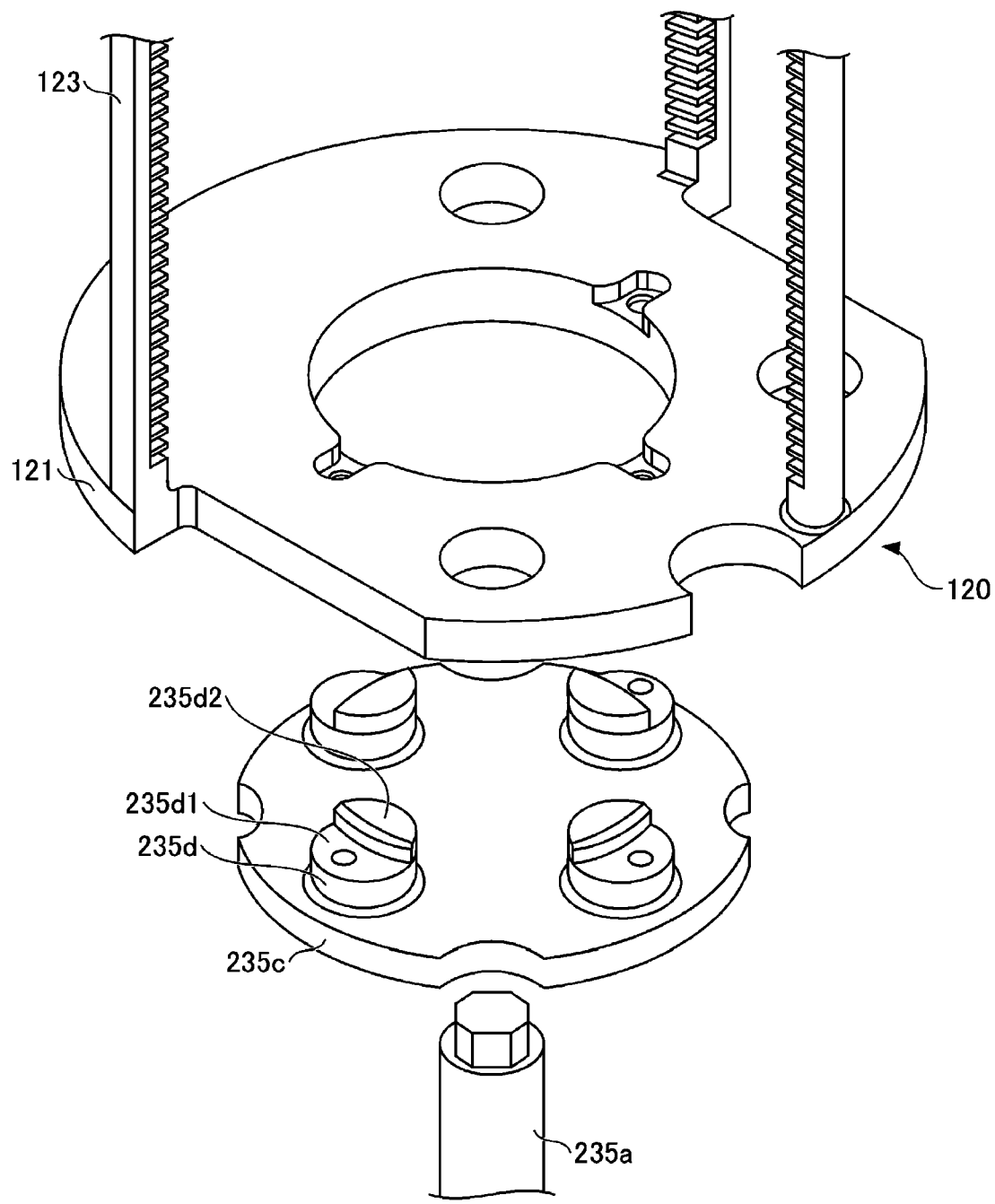
FIG. 13 is an exploded perspective view illustrating the inner support.
Figure 14:
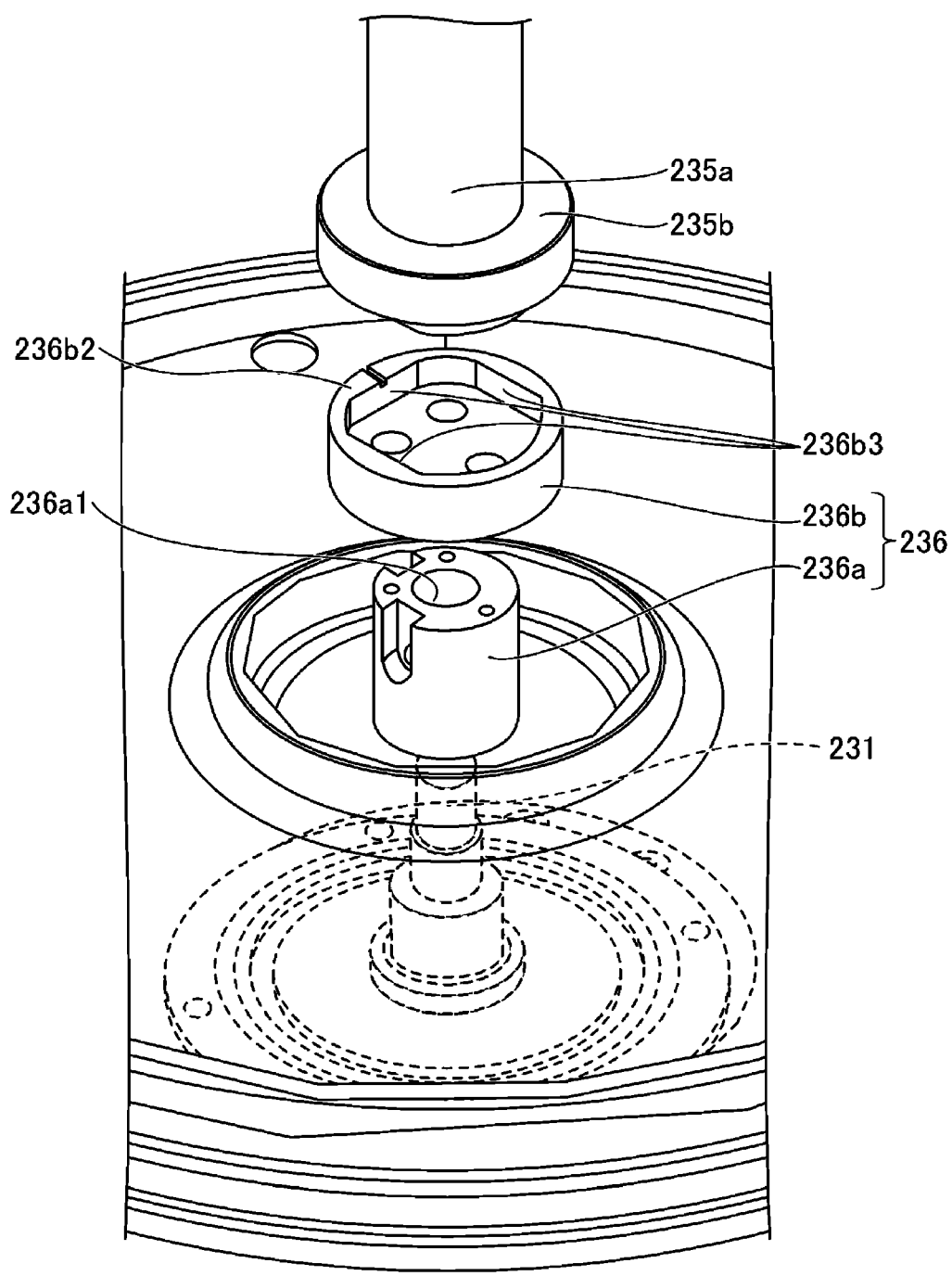
FIG. 14 is an exploded perspective view illustrating the inner connector.
Figure 15A:
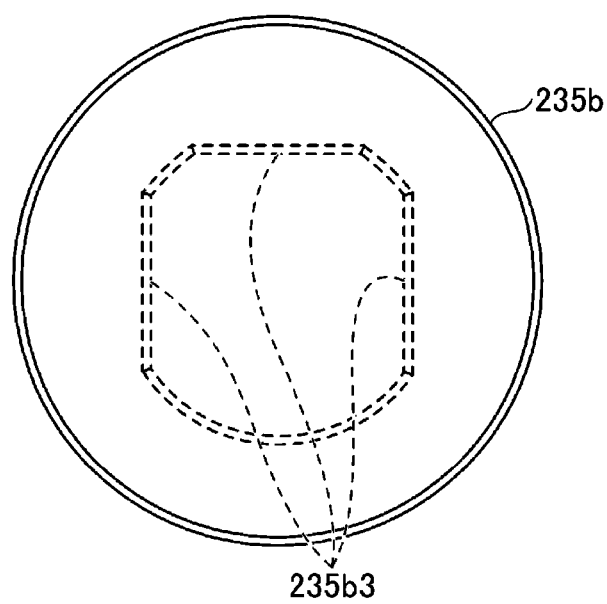
FIGS. 15A, 15B, and 15C are plan views illustrating the inner connector.
Figure 15B:
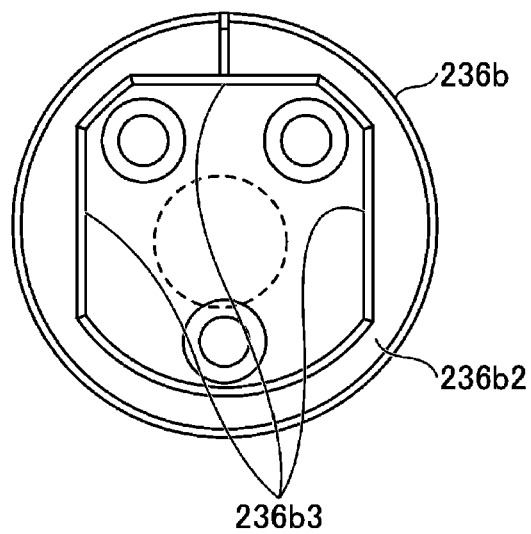
Figure 15C:
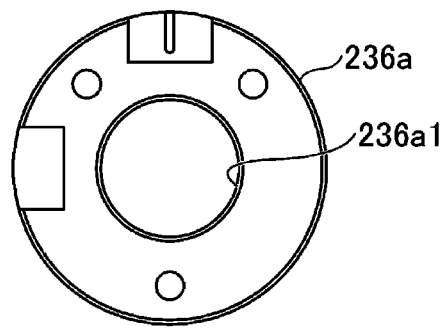

Each support protrusion 235*d* includes a mounting surface 235*d*1 and a positioner 235*d*2 (see FIG. 13). The second boat 120 is supported on the support protrusions 235*d* in a state of being positioned on the support protrusions 235*d* by mount the bottom plate 121 on each mounting surface 235*d*1 and engaging an inner peripheral surface of the bottom plate 121 with the positioner 235*d*2.

The inner connector 236 connects the linear motion shaft 231 and the inner support 235. The inner connector 236 includes a hub 236*a* and a hub 236*b*.

The hub 236*a* is made of the same material as the material constituting the linear motion shaft 231, for example, a metal. The hub 236*a* has a substantially hollow cylindrical shape in which a through-hole 236*a*1 penetrating in the vertical direction is formed. An inner diameter of a lower end of the through-hole 236*a*1 is set to be slightly larger than an outer diameter of the upper end of the linear motion shaft 231. As a result, the linear motion shaft 231 can be inserted into the through-hole 236*a*1, and fit into the hub 236*a*. The hub 236*a* is fixed to the linear motion shaft 231 by a screw or the like. An inner diameter of an upper end of the through-hole 236*a*1 is set to be slightly larger than an outer diameter of a lower end of the hub 236*b*. As a result, the lower end of the hub 236*b* can be inserted into the through-hole 236*a*1, and the hub 236*b* can be fit into the hub 236*a*.

The hub 236*b* is made of a material having a smaller thermal expansion coefficient than the material constituting the hub 236*a* and having a larger thermal expansion coefficient than the material constituting the inner support 235. For example, the hub 236*b* is made of a ceramic material such as $Si_3N_4$ or the like. A substantially annular guide protrusion 236*b*2 protruding from an upper surface of the hub 236*b* is formed on an outer edge of the upper surface of the hub 236*b*. The guide protrusion 236*b*2 has three flat surface portions 236*b*3. An inner diameter of the guide protrusion 236*b*2 is set to be slightly larger than an outer diameter of a lower end of the lower end portion 235*b*. As a result, the lower end of the lower end portion 235*b* is fit into the hub 236*b*. Further, three flat surface portions 235*b*3 corresponding to the three flat surface portions 236*b*3 are formed at the lower end of the lower end portion 235*b*. As the three flat surface portions 235*b*3 are engaged with the three flat surface portions 236*b*3, the inner support 235 is positioned relative to the hub 236*b*.

According to the present disclosure in some embodiments, it is possible to prevent a substrate from sticking to a boat.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a first boat configured to hold substrates in a shelf shape;
   a second boat provided coaxially with the first boat and configured to hold substrates in a shelf shape; and
   a drive configured to rotate the first boat and the second boat in a synchronized manner and configured to raise and lower the second boat relative to the first boat,
   wherein the drive includes:
   a substantially cylindrical fixed sleeve;
   a substantially cylindrical rotary shaft inserted into the fixed sleeve with a gap left therebetween and configured to rotate relative to the fixed sleeve;
   a substantially cylindrical outer support configured to support the first boat; and
   an outer connector configured to connect the rotary shaft and the outer support,
   wherein the rotary shaft and the outer support are made of materials having different thermal expansion coefficients, and
   wherein the outer connector includes a hub made of a material having a thermal expansion coefficient between the thermal expansion coefficient of the material constituting the rotary shaft and the thermal expansion coefficient of the material constituting the outer support.

2. The substrate processing apparatus of claim 1, wherein an introduction port for introducing an inert gas into the gap between the fixed sleeve and the rotary shaft is formed in the fixed sleeve.

3. The substrate processing apparatus of claim 2, wherein the drive includes a linear motion shaft inserted into the rotary shaft with a gap left therebetween and configured to move up and down relative to the rotary shaft.

4. The substrate processing apparatus of claim 3, wherein a through-hole for bringing the gap between the fixed sleeve and the rotary shaft into communication with the gap between the rotary shaft and the linear motion shaft is formed in the rotary shaft.

5. The substrate processing apparatus of claim 4, wherein the drive includes a bellows configured to airtightly seal the gap between the rotary shaft and the linear motion shaft.

6. The substrate processing apparatus of claim 5, wherein the drive includes:
a substantially columnar inner support inserted into the outer support with a gap left therebetween and configured to support the second boat; and
an inner connector configured to connect the linear motion shaft and the inner support.

7. The substrate processing apparatus of claim 6, wherein a through-hole penetrating a side wall of the outer support is formed in the outer support.

8. The substrate processing apparatus of claim 7, wherein the linear motion shaft and the inner support are made of materials having different thermal expansion coefficients, and
wherein the inner connector includes a hub made of a material having a thermal expansion coefficient between the thermal expansion coefficient of the material constituting the linear motion shaft and the thermal expansion coefficient of the material constituting the inner support.

9. The substrate processing apparatus of claim 3, wherein the drive includes a bellows configured to airtightly seal the gap between the rotary shaft and the linear motion shaft.

10. The substrate processing apparatus of claim 3, wherein the drive includes:
a substantially columnar inner support inserted into the outer support with a gap left therebetween and configured to support the second boat; and
an inner connector configured to connect the linear motion shaft and the inner support.

11. The substrate processing apparatus of claim 1, wherein the drive includes a linear motion shaft inserted into the rotary shaft with a gap left therebetween and configured to move up and down relative to the rotary shaft.

12. A substrate processing apparatus, comprising:
a first boat configured to hold substrates in a shelf shape;
a second boat provided coaxially with the first boat and configured to hold substrates in a shelf shape; and
a drive configured to rotate the first boat and the second boat in a synchronized manner and configured to raise and lower the second boat relative to the first boat,
wherein the drive includes:
a substantially cylindrical fixed sleeve;
a substantially cylindrical rotary shaft inserted into the fixed sleeve with a gap left therebetween and configured to rotate relative to the fixed sleeve;
a linear motion shaft inserted into the rotary shaft with a gap left therebetween and configured to move up and down relative to the rotary shaft;
a substantially columnar inner support inserted into the outer support with a gap left therebetween and configured to support the second boat; and
an inner connector configured to connect the linear motion shaft and the inner support, and
wherein the linear motion shaft and the inner support are made of materials having different thermal expansion coefficients, and wherein the inner connector includes a hub made of a material having a thermal expansion coefficient between the thermal expansion coefficient of the material constituting the linear motion shaft and the thermal expansion coefficient of the material constituting the inner support.

* * * * *